United States Patent
Homan et al.

(10) Patent No.: US 9,666,435 B2
(45) Date of Patent: May 30, 2017

(54) APPARATUS AND PROCESS FOR INTEGRATED GAS BLENDING

(71) Applicant: Advanced Technology Materials, Inc., Danbury, CT (US)

(72) Inventors: Jeffrey J. Homan, Ladson, SC (US); Jose I. Arno, Brookfield, CT (US); Joseph D. Sweeney, Winsted, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 13/964,745

(22) Filed: Aug. 12, 2013

(65) Prior Publication Data

US 2013/0330917 A1 Dec. 12, 2013

Related U.S. Application Data (63) Continuation of application No. 11/993,795, filed as application No. PCT/US2006/024308 on Jun. 22, 2006, now abandoned.

(Continued)

(51) Int. Cl.
*H01L 21/00* (2006.01)
*H01L 21/22* (2006.01)
(Continued)

(52) U.S. Cl.
CPC .......... *H01L 21/2225* (2013.01); *B01F 3/028* (2013.01); *B01F 15/0022* (2013.01);
(Continued)

(58) Field of Classification Search
None
See application file for complete search history.

(56) References Cited

U.S. PATENT DOCUMENTS 3,602,778 A * 8/1971 Ura et al. ............ 257/603
3,615,203 A * 10/1971 Kaneko et al. ......... 117/77
(Continued)

FOREIGN PATENT DOCUMENTS

| KR | 10-2006-0032134 A | 4/2006 |
|---|---|---|
| WO | 2004088718 A2 | 10/2004 |
| WO | 2005114692 A2 | 12/2005 |

OTHER PUBLICATIONS

"Fundamentals of Mass Flow Controlling" by Advanced Energy, 2005.*

(Continued)

*Primary Examiner* — Evren Seven
(74) *Attorney, Agent, or Firm* — Nidhi G. Kissoon; John E. Pillion (57) ABSTRACT

A system (10) for delivery of dilute fluid, utilizing an active fluid source (12), a diluent fluid source (14), a fluid flow metering device (24) for dispensing of one of the active and diluent fluids, a mixer (38) arranged to mix the active and diluent fluids to form a diluted active fluid mixture, and a monitor (42) arranged to sense concentration of active fluid and/or diluent fluid in the diluted active fluid mixture, and responsively adjust the fluid flow metering device (24) to achieve a predetermined concentration of active fluid in the diluted active fluid mixture. A pressure controller (34) is arranged to control flow of the other of the active and diluent fluids so as to maintain a predetermined pressure of the diluted active fluid mixture dispensed from the system. The fluid dispensed from the system then can be adjustably controlled by a flow rate controller, e.g., a mass flow controller, to provide a desired flow to a fluid-utilizing unit, such as a semiconductor process tool. An end point monitoring assembly is also described, for switching fluid sources (Continued)

(12, 15) to maintain continuity of delivery of the diluted active fluid mixture.

21 Claims, 1 Drawing Sheet

Related U.S. Application Data (60) Provisional application No. 60/693,015, filed on Jun. 22, 2005.

(51) Int. Cl.

| | | |
|---|---|---|
| *B01F 3/02* | (2006.01) | |
| *B01F 15/00* | (2006.01) | |
| *B01F 15/04* | (2006.01) | |
| *F17C 5/06* | (2006.01) | |
| *F17C 7/02* | (2006.01) | |
| *F17C 13/02* | (2006.01) | |
| *G05D 11/13* | (2006.01) | |

(52) U.S. Cl.
CPC .. *B01F 15/00207* (2013.01); *B01F 15/00285* (2013.01); *B01F 15/0429* (2013.01); *F17C 5/06* (2013.01); *F17C 7/02* (2013.01); *F17C 13/02* (2013.01); *F17C 13/025* (2013.01); *G05D 11/132* (2013.01); *F17C 2221/01* (2013.01); *F17C 2221/03* (2013.01); *F17C 2223/0123* (2013.01); *F17C 2223/035* (2013.01); *F17C 2225/0123* (2013.01); *F17C 2225/035* (2013.01); *F17C 2227/0157* (2013.01); *F17C 2250/032* (2013.01); *F17C 2250/043* (2013.01); *F17C 2250/0443* (2013.01); *F17C 2250/0447* (2013.01); *F17C 2250/0452* (2013.01); *F17C 2250/0626* (2013.01); *F17C 2265/025* (2013.01); *F17C 2270/0518* (2013.01); *Y10T 137/2509* (2015.04); *Y10T 137/87571* (2015.04)

(56) References Cited

U.S. PATENT DOCUMENTS

| | | | | |
|---|---|---|---|---|
| 3,625,749 | A * | 12/1971 | Yoshioka et al. | 438/779 |
| 3,658,586 | A * | 4/1972 | Wang | 428/700 |
| 3,725,749 | A * | 4/1973 | Groves et al. | 257/87 |
| 4,042,344 | A | 8/1977 | Callcott et al. | |
| 4,100,310 | A * | 7/1978 | Ura et al. | 438/5 |
| 4,128,733 | A * | 12/1978 | Fraas et al. | 136/255 |
| 4,275,752 | A | 6/1981 | Collier et al. | |
| 4,369,031 | A * | 1/1983 | Goldman et al. | 432/198 |
| 4,600,801 | A * | 7/1986 | Guha et al. | 136/249 |
| 4,619,729 | A * | 10/1986 | Johncock et al. | 430/128 |
| 4,816,294 | A | 3/1989 | Tsuo et al. | |
| 4,936,877 | A | 6/1990 | Hultquist et al. | |
| 5,047,352 | A | 9/1991 | Stetter et al. | |
| 5,054,309 | A | 10/1991 | Mettes et al. | |
| 5,129,412 | A | 7/1992 | Hendry | |
| 5,239,856 | A | 8/1993 | Mettes et al. | |
| 5,279,146 | A | 1/1994 | Asano et al. | |
| 5,282,473 | A | 2/1994 | Braig et al. | |
| 5,376,409 | A | 12/1994 | Kaloyeros et al. | |
| 5,403,089 | A | 4/1995 | Kuo et al. | |
| 5,436,180 | A * | 7/1995 | de Fresart et al. | 438/341 |
| 5,470,390 | A | 11/1995 | Nishikawa et al. | |
| 5,516,366 | A * | 5/1996 | Kanno et al. | 118/715 |
| 5,518,528 | A | 5/1996 | Tom et al. | |
| 5,570,743 | A | 11/1996 | Padgett et al. | |
| 5,704,965 | A | 1/1998 | Tom et al. | |
| 5,704,967 | A | 1/1998 | Tom et al. | |
| 5,707,424 | A | 1/1998 | Tom et al. | |
| 5,782,974 | A | 7/1998 | Sorensen et al. | |
| 5,826,607 | A | 10/1998 | Knutson et al. | |
| 5,834,371 | A * | 11/1998 | Ameen et al. | 438/656 |
| 5,887,611 | A | 3/1999 | Lampotang et al. | |
| 5,916,245 | A | 6/1999 | Tom | |
| 6,050,283 | A | 4/2000 | Hoffman et al. | |
| 6,067,840 | A | 5/2000 | Chelvayohan et al. | |
| 6,070,600 | A | 6/2000 | Grootegoed et al. | |
| 6,077,355 | A * | 6/2000 | Yamashita et al. | 118/708 |
| 6,080,297 | A * | 6/2000 | Ayers | 205/464 |
| 6,089,027 | A | 7/2000 | Wang et al. | |
| 6,101,816 | A | 8/2000 | Wang et al. | |
| 6,110,257 | A | 8/2000 | Tom | |
| 6,190,436 | B1 | 2/2001 | Ji et al. | |
| 6,333,272 | B1 * | 12/2001 | McMillin et al. | 438/710 |
| 6,346,452 | B1 * | 2/2002 | Kabir et al. | 438/312 |
| 6,370,950 | B1 | 4/2002 | Lammerink | |
| 6,406,555 | B1 | 6/2002 | Grootegoed et al. | |
| 6,453,924 | B1 | 9/2002 | Wang et al. | |
| 6,612,317 | B2 | 9/2003 | Costantini et al. | |
| 6,617,175 | B1 | 9/2003 | Arno | |
| 6,631,334 | B2 | 10/2003 | Grosshart | |
| 6,689,252 | B1 | 2/2004 | Shamouilian et al. | |
| 6,694,800 | B2 | 2/2004 | Weckstrom et al. | |
| 6,763,843 | B1 | 7/2004 | Dickerson, Jr. et al. | |
| 6,772,781 | B2 * | 8/2004 | Doty et al. | 137/9 |
| 6,810,821 | B2 | 11/2004 | Chan | |
| 6,821,795 | B2 | 11/2004 | Arno | |
| 6,835,414 | B2 * | 12/2004 | Ramm | 427/248.1 |
| 6,909,973 | B2 | 6/2005 | Arno | |
| 7,011,614 | B2 | 3/2006 | Arno | |
| 7,058,519 | B2 | 6/2006 | Arno | |
| 7,063,097 | B2 | 6/2006 | Arno et al. | |
| 7,129,519 | B2 | 10/2006 | Arno | |
| 7,172,918 | B2 | 2/2007 | Arno | |
| 7,325,560 | B2 | 2/2008 | Arno et al. | |
| 7,373,257 | B2 | 5/2008 | Arno | |
| 7,711,496 | B2 | 5/2010 | Arno | |
| 7,925,450 | B2 | 4/2011 | Arno | |
| 8,244,482 | B2 | 8/2012 | Arno | |
| 8,603,252 | B2 | 12/2013 | Dimeo et al. | |
| 2001/0013363 | A1 | 8/2001 | Kitayama et al. | |
| 2001/0032668 | A1 | 10/2001 | Doty et al. | |
| 2002/0018897 | A1 * | 2/2002 | Kuckertz et al. | 428/409 |
| 2002/0048213 | A1 | 4/2002 | Wilmer et al. | |
| 2002/0051132 | A1 | 5/2002 | Ohno et al. | |
| 2002/0145711 | A1 * | 10/2002 | Magome et al. | 355/30 |
| 2002/0155724 | A1 * | 10/2002 | Sakai et al. | 438/710 |
| 2002/0168289 | A1 | 11/2002 | McVey | |
| 2003/0019580 | A1 * | 1/2003 | Strang | 156/345.33 |
| 2004/0002170 | A1 * | 1/2004 | Shimizu et al. | 438/5 |
| 2004/0007180 | A1 | 1/2004 | Yamasaki et al. | |
| 2004/0018746 | A1 * | 1/2004 | Arno | 438/758 |
| 2004/0050326 | A1 | 3/2004 | Thilderkvist et al. | |
| 2004/0083962 | A1 * | 5/2004 | Bang et al. | 118/715 |
| 2004/0206241 | A1 | 10/2004 | Tempel et al. | |
| 2005/0006799 | A1 | 1/2005 | Gregg et al. | |
| 2005/0126030 | A1 * | 6/2005 | Ohmi | H01L 21/67034 34/58 |
| 2006/0086376 | A1 | 4/2006 | Dimeo, Jr. et al. | |
| 2006/0174941 | A1 * | 8/2006 | Cohen et al. | 137/93 |
| 2006/0263916 | A1 | 11/2006 | Arno | |
| 2010/0224264 | A1 | 9/2010 | Homan et al. | |

OTHER PUBLICATIONS

Adrian, P., "Sensor industry developments and trends", "Sensor Business Digest", Oct. 2001, Publisher: Vital Information Publication, Inc. (accessed via www.sensormag.com/resources/businessdigest/sbd1001.shtml).

Mohn, J., et al., "Process Gas Analysis by FTIR for the Semiconductor Industry", "CTI Micro and Nano Technologies, Neuchatel", Nov. 2004, p. 1 Publisher: EMPA Technologies.

Perry, R., et al., "Perry's Chemical Engineers' Handbook (7th Edition)", 1997, Secs. 6,8, 16, 18, Publisher: McGraw-Hill, Published in: New York, NY.

Schilz, J., "Applications of thermoelectric infrared sensors (thermopiles): Gas detection by infrared absorption; NDIR", "Thermophysica Minima", Aug. 22, 2000, pp. 1-11, Publisher: PerkinElmer.

(56) References Cited

OTHER PUBLICATIONS

Thermometrics Global Business, "Application note of thermopile IR sensors (Rev.02)", 2000, pp. 1-9.
Wilks, P., "The birth of infrared filtometry", "Spectroscopy Showcase", Mar. 2002, p. 14.

\* cited by examiner

APPARATUS AND PROCESS FOR INTEGRATED GAS BLENDING

CITED REFERENCE TO RELATED APPLICATIONS

This application is a continuation under 35 USC 120 of U.S. patent application Ser. No. 11/993,795 filed Dec. 21, 2007 which in turn is a national phase under 35 U.S.C. §371 of International Patent Application No. PCT/US2006/024308 filed Jun. 22, 2006, which in turn claims the benefit of priority under 35 USC 119 of U.S. Provisional Patent Application No. 60/693,015 filed Jun. 22, 2005. The disclosures of all of said applications are hereby incorporated herein by reference in their respective entireties, for all purposes.

BACKGROUND OF THE INVENTION

Field of the Invention

The present invention relates to apparatus and method for supplying dilute gases at predetermined concentrations, e.g., as source gas for ion implantation doping of semiconductor or other microelectronic device materials.

Description of the Related Art

The semiconductor industry uses a wide variety of dilute gases in applications where the source material is highly toxic or hazardous and the dosage of active gas species is small.

For instance, ion implantation doping of epitaxial films by requires source gases such as arsine, phosphine, and germane in highly dilute states. As an example, arsenic may be implanted in a semiconductor film for doping thereof, from a dilute arsine/hydrogen gas mixture. In such arsenic doping application, a source gas of low arsine content e.g., 50 parts per million (ppm) may be further diluted with hydrogen to achieve a desired hydrogen/arsine gas mixture. The flows of the dilute arsine starting material and the diluent hydrogen that is added thereto to form the final dilute arsine gas mixture can be controlled by mass flow controllers, to deliver a metered amount of the final diluted arsine to the ionizer unit of the ion implant system.

Generally, two primary approaches are utilized in the semiconductor industry for supplying an active gas (such term being used hereinafter to designate the gas component of interest, such as the dopant gas species) in diluted form in a gas mixture useful for a desired application.

A first category of dilute gas supply techniques utilizes pre-mixed high-pressure gas mixtures (containing the low-concentration active gas component) as the source gas medium, as dispensed for use from high-pressure gas supply vessels such as pressurized gas cylinders. This gas supply approach has the following deficiencies:

(1) the gas supply vessels are exhausted at a high rate, requiring numerous change-outs of the gas supply vessels during the operation of the active gas-consuming process;
(2) when gas supply vessels are changed out as they are exhausted, the active gas-consuming process may need to be re-qualified, since the concentration of active gas supplied from a freshly installed gas supply vessel may be different from the concentration dispensed from a previously installed gas supply vessel;
(3) in addition to deficiency (2), the gas concentration of the active gas dispensed from any given gas supply vessel is fixed by the gas supply vessel manufacturer, and there is no capability of delivering varying concentrations depending on time-varying conditions in the downstream active gas-consuming process;
(4) the concentration of the active gas in the gas mixture stored in the gas supply vessel can change with time due to decomposition of the active gas component, or the concentration of the active gas can vary with successive change-outs of gas supply vessels, in an unknown and unexpected manner; and
(5) the gas supply vessel typically is at high atmospheric pressure to maximize inventory of the active gas in the vessel, entailing a potentially unsafe situation if the gas supply vessel ruptures or leakage from the associated head assembly, valves, etc. of the vessel occurs.

The second general category of dilute gas supply techniques involves in-situ generation of gas, using solids or liquid raw materials to generate the desired gas species through chemical reaction. In-situ gas generation has the following associated deficiencies:

(1) the time required to initiate gas generation and achieve steady-state gas production is generally substantial and does not permit a quick-response turn-on of gas dispensing to be achieved;
(2) the raw materials used as reactants for in-situ gas generation are frequently highly toxic in character, thereby raising safety and operational issues;
(3) in-situ gas generators are typically relatively complex systems, including for example, gas generation chambers, reactant supplies, reactant flow circuitry (since even in the case of solid reactant sources, there is typically a fluid co-reactant), dispensing lines, and associated in-line filters, purifiers, interlocks, etc.;
(4) in-situ gas generators as conventionally employed involve consumable parts requiring periodic replacement, e.g., filters and purifiers; and
(5) in-situ gas generation systems are relatively expensive, both in capital expenditure and in overall cost of ownership.

U.S. Pat. No. 7,063,097 issued Jun. 20, 2006 to Jose I. Arno and James A. Dietz for "In-Situ Gas Blending and Dilution System for Delivery of Dilute Gas at a Predetermined Concentration" describes an in-situ gas blending and dilution system for delivery of dilute gas at a predetermined concentration, which includes an active gas source and a diluent gas source. A gas flow-metering device is provided for dispensing the active gas at a predetermined flow rate. A gas blender mixer is arranged to mix (i) active gas from the active gas source that is dispensed at the predetermined flow rate by the gas flow-metering device, with (ii) diluent gas, to form a diluted active gas mixture. The system further includes a monitor arranged to sense concentration of active gas in the diluted active gas mixture and to responsively adjust the gas flow-metering device, to control the dispensing rate of the active gas, and maintain a predetermined concentration of active gas in the diluted active gas mixture.

In one embodiment of the system described in U.S. Pat. No. 7,063,097, as adapted for delivery of gas for ion implantation in a semiconductor manufacturing facility, the monitor includes a thermopile infrared (TPIR) detector, and the system utilizes a variable restricted flow orifice (RFO) as a flow control device for the source gas, and a mass flow controller (MFC) as a flow control device for the diluent gas, with a micro-pump to deliver a specific concentration of the source gas to the semiconductor manufacturing ion implant tool from the gas blender.

In such ion implantation system, it is desirable to be able to control the overall flow of the diluted gas mixture that is entering the ion implant tool from the gas blender. This is problematic, however, since any adjustment of the flow rate causes the pressure maintained inside the gas blender to change. This in turn disrupts the gas concentration signal that is being sensed by the TPIR detector, since the signal sensed by the TPIR detector is directly proportional to both temperature and pressure. Any change in pressure causes the calibration of the TPIR to be inaccurate, with the result that an incorrect concentration of the source gas in the diluted mixture is caused to be fed to the semiconductor manufacturing tool.

Additionally, in such ion implantation system, if the blender is operated at extremely low pressures, e.g., at less than 50 torr, the TPIR detector may be unable to sense any level of source gas.

This inability to accurately control concentration under adjusted flow rates, and potential inability to sense diluted source gas concentration at very low pressures, present significant operating issues.

The active gas source used in gas blender delivery systems of the type discussed above can include fluid storage and dispensing packages in which a physical adsorbent retains the active gas thereon in a vessel, for desorption of the active gas and discharge from the vessel under dispensing conditions. Such gas supply systems are commercially available from ATMI, Inc., Danbury, Conn., USA under the trademarks SDS and SAGE and are described, for example, in U.S. Pat. Nos. 5,518,528; 5,704,965; 5,704,967; and 5,707,424.

The active gas source used in the gas blender delivery system alternatively can include a fluid storage and dispensing package in which a pressure regulator is positioned in the interior volume of a vessel holding the active fluid under pressure. The pressure regulator is arranged with a set point permitting dispensing of gas deriving from the fluid, at pressure determined by the set point, e.g., a subatmospheric pressure providing a high level of safety in operation. Internal regulator gas supply packages of such type are commercially available from ATMI, Inc., Danbury, Conn., USA under the trademark VAC and are described, for example, in U.S. Pat. Nos. 6,101,816 and 6,089,027.

In the use of the above-mentioned SDS, SAGE and VAC packages for supply of active gas in the above-described gas blender delivery systems, it frequently is unclear to the user when the gas storage and dispensing package is approaching exhaustion. As a result of such uncertainty, the package may be taken out of service at a premature point in time, relative to the actual point of exhaustion, with consequent waste of residual active gas remaining in the package and adverse effect on the economics of the process using the active gas. Alternatively, the package may continue to be operated until total exhaustion of the active gas has occurred, and the package is "running dry." As a result, the process being serviced by the empty package must be stopped, to accommodate change out of the gas supply package and introduction of a fresh package of the active gas. This circumstance involves extended down-time periods in the operation of the microelectronic product manufacturing facility, with resulting adverse economic impact on the facility.

Accordingly, the microelectronic product manufacturing industry has continuing need for improved gas supply sources and monitoring of gas-dispensing operations, for efficient and economic delivery of dilute gases to process equipment.

SUMMARY OF THE INVENTION

The present invention relates to a system for delivery of diluted fluid, e.g., to a fluid-utilizing unit such as an ion implantation tool employed for manufacture of semiconductor devices and integrated circuit structures, or other microelectronic device manufacturing operation.

In one aspect, the present invention relates to a system for delivery of dilute fluid, including:
an active fluid source;
a diluent fluid source;
a fluid flow metering device for dispensing of one of the active and diluent fluids;
a mixer arranged to mix the active and diluent fluids to form a diluted active fluid mixture;
a monitor arranged to sense concentration of active fluid and/or diluent fluid in the diluted active fluid mixture, and responsively adjust the fluid flow metering device to achieve a predetermined concentration of active fluid in the diluted active fluid mixture; and
a pressure controller arranged to control flow of the other of the active and diluent fluids so as to maintain a predetermined pressure of the diluted active fluid mixture dispensed from the system.

In another aspect, the invention relates to a system for delivery of dilute fluids, comprising:
an active fluid source;
a diluent fluid source;
a gas flow metering device that is joined in fluid flow communication with the active fluid source, and selectively adjustable to dispense active fluid at predetermined flow rate;
a pressure controller that is joined in fluid flow communication with the diluent fluid source, and arranged to dispense diluent fluid at predetermined pressure;
a mixer arranged to mix the dispensed active fluid at predetermined flow rate with the dispensed diluent fluid at predetermined pressure, to form a diluted active fluid mixture; and
a monitor arranged to (i) sense concentration of active fluid in the diluted active fluid mixture prior to dispensing thereof from the system, and (ii) responsively adjust the fluid flow metering device, to control dispensing rate of the active fluid so as to maintain a predetermined concentration of active fluid in the diluted active fluid mixture dispensed from the system.

In another aspect, the invention relates to a fluid blender apparatus, comprising:
flow circuitry arranged for connection to an active fluid source and to a diluent fluid source;
a fluid flow metering device that is joined in fluid flow communication with the active fluid source flow circuitry, and selectively adjustable to dispense active fluid at predetermined flow rate;
a pressure controller that is joined in fluid flow communication with the diluent fluid source flow circuitry, and arranged to dispense diluent fluid at predetermined pressure;
a mixer arranged to mix the dispensed active fluid at predetermined flow rate with the dispensed diluent fluid at predetermined pressure, to form a diluted active fluid mixture; and
a monitor arranged to (i) sense concentration of active fluid in the diluted active fluid mixture prior to dispensing thereof from the fluid blender apparatus, and (ii) responsively adjust the fluid flow metering device, to control dispensing rate of the active fluid so as to maintain a predetermined concentration of active fluid in the diluted active fluid mixture dispensed from the fluid blender apparatus;

wherein the fluid flow metering device, pressure controller, mixing device and monitor are contained in a fluid blender box, and the flow circuitry is arranged for connection to active fluid and diluent fluid sources located exterior of the fluid blender box, and the diluted active fluid mixture is dispensed to a site exterior of the box.

A still further aspect of the invention relates to an apparatus for delivery of dilute fluid, wherein said apparatus is adapted for coupling with an active fluid source and with a diluent fluid source, to deliver the dilute fluid as a mixture of active fluid from the active fluid source, and diluent fluid from the diluent fluid source, such apparatus comprising:

a fluid flow metering device that is adapted to be joined in fluid flow communication with the active fluid source, and selectively adjustable to dispense active fluid at predetermined flow rate;

a pressure controller that is adapted to be joined in fluid flow communication with the diluent fluid source, to dispense diluent fluid at predetermined pressure;

a mixer arranged to mix the dispensed active fluid at predetermined flow rate with the dispensed diluent fluid at predetermined pressure, to form a diluted active fluid mixture; and a monitor arranged to (i) sense concentration of active fluid in the diluted active fluid mixture prior to dispensing of the diluted active fluid mixture, and (ii) responsively adjust the fluid flow metering device, to control dispensing rate of the active fluid so as to maintain a predetermined concentration of active fluid in the dispensed diluted active fluid mixture.

In various further aspects, the invention relates to methods of delivering fluid, utilizing apparatus and systems of the foregoing types.

Another aspect of the invention relates to a method for delivery of dilute fluid, comprising:

providing an active fluid source and a diluent fluid source;

controllably dispensing one of the active fluid and diluent fluid from its fluid source at predetermined flow rate;

dispensing the other of the active fluid and diluent fluid from its fluid source at predetermined pressure;

mixing dispensed active fluid with dispensed diluent fluid, to form a diluted active fluid mixture;

monitoring concentration of at least one of the active and diluent fluids in the diluted active fluid mixture, and responsively adjusting the dispensing rate of the fluid dispensed at predetermined flow rate, to maintain a predetermined concentration of active fluid in the diluted active fluid mixture; and dispensing the diluted active fluid mixture for use.

In yet another aspect, the invention relates to a method for delivery of dilute fluid, comprising:

and providing an active fluid source and a diluent fluid source;

controllably dispensing active fluid from the active fluid source at predetermined flow rate;

dispensing diluent fluid from the diluent fluid source at predetermined pressure;

mixing active fluid from the active fluid source that is dispensed at said predetermined flow rate, with diluent fluid from the diluent fluid source, to form a diluted active fluid mixture;

monitoring concentration of active fluid in the diluted active fluid mixture, and responsively adjusting the dispensing rate of the active fluid, to maintain a predetermined concentration of active fluid in the diluted active fluid mixture; and dispensing the diluted active fluid mixture for use.

A further aspect of the invention relates to a system for delivery of dilute fluid, including:

an active fluid source;

a diluent fluid source;

a fluid flow metering device for dispensing of one of the active and diluent fluids;

a mixer arranged to mix the active and diluent fluids to form a diluted active fluid mixture;

a monitor arranged to sense concentration of active fluid and/or diluent fluid in the diluted active fluid mixture, and responsively adjust the fluid flow metering device to achieve a predetermined concentration of active fluid in the diluted active fluid mixture; and at least one of:

(I) a pressure controller arranged to maintain a predetermined pressure of the diluted active fluid mixture dispensed from the system; and (II) an end point detector assembly arranged to determine when at least one of the active fluid source and diluent fluid source is empty or approaching an empty or near-empty condition, and to responsively disable such fluid source(s) from fluid dispensing.

Another aspect of the invention relates to a method of blending fluids to form a multicomponent fluid, said method comprising monitoring the multicomponent fluid for concentration of one or more of components thereof, and responsively modulating the blending to maintain the concentration of said one or more components at predetermined level(s) in the multicomponent fluid, monitoring pressure of at least one of the blending fluids, and responsively modulating the flow of at least one of the blending fluids to maintain pressure of the multicomponent fluid at predetermined level(s).

A still further aspect of the invention relates to a method of making a microelectronic product, comprising use of the multicomponent fluid prepared by the method of the preceding paragraph.

Yet another aspect of the invention relates to a fluid delivery assembly, including a monitor adapted to determine concentration of one or more components of a multicomponent fluid, a controller operatively coupled to the monitor to respond to the determined concentration and generate a correlative output, a flow control device arranged to modulate flow of one or more components of the multicomponent fluid in response to the correlative output, a mixer arranged to mix components to form the multicomponent fluid, and a pressure controller adapted to maintain predetermined pressure of multicomponent fluid introduced to said monitor.

In another aspect, the invention relates to a microelectronic product manufacturing facility comprising a fluid delivery assembly as described herein.

Additional aspects of the invention relates to methods of delivering fluid, and to methods of making microelectronic products.

A further aspect of the invention relates to a method of combining two or more fluids to form a multicomponent fluid containing a predetermined concentration of one or more component fluids therein, said method comprising blending said two or more fluids with modulated addition of one or more but less than all of said two or more fluids, wherein such addition is modulated in response to concentration sensing of at least one of said one or more but less than all of said two or more fluids, and controlling pressure of the multicomponent fluid so that same is at predetermined pressure. In lieu of, or addition to, pressure control of the multicomponent fluid, other multicomponent fluid parameters may be controlled in specific embodiments of the invention, such as temperature, density, turbidity, etc.

Another aspect of the invention relates to a method of manufacturing a microelectronic product, comprising use of a multicomponent fluid as produced by the method of the preceding paragraph.

A further aspect of the invention relates to a subassembly coupleable with sources of active fluid and diluent fluid, for blending thereof to deliver dilute fluid, such subassembly including:

a fluid flow metering device adapted to dispense one of the active and diluent fluids;

a mixer arranged to mix the active and diluent fluids to form a diluted active fluid mixture;

a monitor arranged to sense concentration of the active fluid and/or the diluent fluid in the diluted active fluid mixture, and to responsively adjust the fluid flow metering device to achieve a predetermined concentration of active fluid in the diluted active fluid mixture; and a pressure controller arranged to control flow of the other of the active and diluent fluids so as to maintain a predetermined pressure of the diluted active fluid mixture dispensed from the system.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The disclosures of U.S. Pat. No. 6,909,973 issued Jun. 20, 2005 in the name of Jose I. Arno for "Photometrically Modulated Delivery of Reagents," and U.S. Pat. No. 7,063,097 issued Jun. 20, 2006 in the names of Jose I. Arno, et al. for "In-Situ Gas Blending and Dilution System for Delivery of Dilute Gas at a Predetermined Concentration" are hereby incorporated herein by reference in their entireties, for all purposes.

The present invention provides a system for delivery of dilute fluid, utilizing an active fluid source, a diluent fluid source, a fluid flow metering device for dispensing of one of the active and diluent fluids, a mixer arranged to mix the active and diluent fluids to form a diluted active fluid mixture, and a monitor arranged to sense concentration of active fluid and/or diluent fluid in the diluted active fluid mixture, and responsively adjust the fluid flow metering device to achieve a predetermined concentration of active fluid in the diluted active fluid mixture. A pressure controller is arranged to control flow of the other of the active and diluent fluids so as to maintain a predetermined pressure of the diluted active fluid mixture dispensed from the system. The fluid dispensed from the system then can be adjustably controlled by a flow rate controller, e.g., a mass flow controller, to provide a desired flow to a fluid-utilizing unit, such as a semiconductor process tool. Semiconductor process tools useful for such purpose can be of any suitable type, e.g., ion implantation tools, chemical vapor deposition tools, epitaxial doping tools, etching tools, etc.

In a specific embodiment, the invention includes an active fluid source, a diluent fluid source, a fluid flow metering device for dispensing of the active fluid, and a mixer, e.g., a mixing device or a housing or chamber containing such device, or a portion of the flow circuitry, or other apparatus or structure that is arranged to mix the active fluid and the diluent fluid for forming a diluted active fluid mixture. A monitor is arranged in this embodiment to sense concentration of active fluid in the diluted active fluid mixture, and responsively adjust the fluid flow metering device for control of dispensing rate of the active fluid, to achieve the predetermined concentration of active fluid in the diluted active fluid mixture that is dispensed from the system. A pressure controller is employed in this embodiment to control diluent fluid flow so as to maintain a predetermined pressure of the diluted active fluid mixture dispensed from the system.

The present invention provides a highly effective system and method for supplying dilute gas at predetermined concentration, e.g., as source gas for ion implantation doping of a semiconductor material.

Additionally, the invention resolves a major problem associated with the use of mass flow controllers for delivering dilute gas, namely, the inability of mass flow controllers used in wafer processing tools to accommodate significant deviations in pressure. Such deficiency of mass flow controllers results in inaccurate monitoring results when MFCs are utilized in streams susceptible to variability in pressure, such as where the flow of carrier gas is modulated to produce a desired concentration of an active gas component in a mixed gas stream formed by combination of the carrier gas with the active gas component.

In one specific embodiment, as hereinafter described in greater detail, the fluid flow metering device includes a variable RFO in a fluid flow line interconnecting the active fluid source and a pump for flowing the active fluid to the mixer, the pressure controller includes an electronic pressure controller and/or a mechanical pressure controller disposed in a fluid flow line interconnecting the diluent gas source and the mixer, the mixer includes a static mixer, and the monitor comprises an in-line fluid analyzer arranged to produce an output control signal correlative to the sensed active fluid concentration in the diluted active fluid mixture, with the control signal being transmitted to the fluid flow metering device to modulate the set point thereof to achieve a predetermined constant active fluid concentration for the desired application of the diluted active fluid mixture.

The invention thereby provides a system for delivery of a controlled pressure diluted fluid mixture including a dilute component fluid at a selected concentration, whereby the user of the dispensed fluid mixture can adjustably control the flow thereof for the desired downstream use thereof at the desired concentration of the dilute component fluid.

The fluid flow metering device can be of any suitable type, including for example a variable RFO device, as discussed illustratively above, or alternatively a mass flow controller, a micro-valve element actuatable for dispensing very low flow rates of the active fluid component from the active fluid supply, a flowmeter coupled with a flow control valve in the dispensing line, or any other element or assembly that is effective to provide a selected flow rate of the active fluid from the active gas source.

The fluid flow metering device in another embodiment includes a fluid regulator element associated with a fluid storage and dispensing vessel, e.g., of a type described in U.S. Pat. No. 6,089,027, wherein the fluid regulator element is operatively coupled with a feedback control loop, arranged to achieve a desired active gas concentration in the dispensed fluid mixture.

The active fluid source can be of any suitable type, e.g., a gas storage and dispensing vessel or container holding the neat active gas to be diluted for use. In one embodiment, the active fluid source comprises a sub-atmospheric pressure active gas storage and dispensing vessel of the type described in U.S. Pat. No. 5,518,528 to Glenn M. Tom et al. and commercially available from ATMI, Inc., Danbury, Conn., USA) under the trademark SDS, wherein active gas is sorptively retained on a physical adsorbent and selectively desorbed therefrom for dispensing of active gas from the vessel. In another embodiment, the neat active fluid source comprises a gas storage and dispensing vessel of the type described in U.S. Pat. No. 6,089,027 to Luping Wang, et al. and commercially available from ATMI, Inc. (Danbury, Conn.) under the trademark VAC, featuring an interiorly disposed regulator element for dispensing of the active gas at a pressure determined by the regulator set point.

The active fluid source may alternatively be constituted and/or arranged, in any suitable manner, e.g., as a supply structure, material or operation. For example, the active fluid source may include a solid physical adsorbent-based package of the type described in U.S. Pat. No. 5,518,528 to Glenn M. Tom et al. In other embodiments, the active fluid may be liberated from a liquid solution, or be generated by an in-situ generator, or be generated from a reactive liquid as described in U.S. Patent Publication No. 20040206241 published October, 2004 for "Reactive Liquid Based Gas Storage and Delivery System," or be obtained from a reactive solid, or from a vaporizable or sublimable solid. In general, any appropriate source or supply of the active fluid can be used. In a specific embodiment, the active fluid source includes a retention structure, as described in U.S. Pat. No. 5,916,245 issued Jun. 29, 1999 for "High Capacity Gas Storage and Dispensing System."

The mixer arranged to mix the active fluid and the diluent fluid for forming a diluted active fluid mixture can be of any suitable type, whereby the active fluid and the diluent fluid are intermixed with one another for discharge at a desired dilute concentration of the active fluid, e.g., for flow to a downstream dilute fluid mixture-utilizing process. The mixer can include a dynamic mixing device such as for example a pump, compressor, rotary mixer, or the like, or alternatively a venturi, static mixer, ejector, eductor, opposed jet-equipped mixing chamber, or other device, structure or assembly that effects mixing of the active fluid and the diluent fluid to produce the diluted active fluid mixture. As a specific example, one mixing device that can advantageously be employed in the practice of the invention is a ConPro Tec ST250-36 static mixer, commercially available from ConPro Tec, Inc. (Salem, N.H., USA). The mixer in another embodiment is constituted by a mixing chamber housing a mixing device, arranged to mix active gas with diluent gas.

The monitor arranged to sense concentration of active fluid in the diluted active fluid mixture, and responsively control the dispensing rate of the active fluid, to achieve a predetermined concentration of active fluid in the diluted active fluid mixture, can be of any suitable type, including spectrometric, spectroscopic, electrochemical, acoustic, thermal, photometric, chromatographic, colorimetric, surface acoustic wave (SAW), photonic and flame ionizer types. Preferred monitor types include TPIR, Fourier Transform-Infrared (FT-IR) and IR photometric monitors. The monitor can be arranged in any suitable manner, e.g., disposed in-line in the diluted active fluid mixture discharge line, or disposed to sample fluid via a side-stream sampling arrangement, or in any other suitable fashion.

The monitor can include one or multiple monitoring devices or components, as desired in a given application of the invention. In instances where multiple monitor devices are employed, to provide monitoring via different sensing modalities, the signals generated by each of the constituent monitoring devices or components that are indicative of the concentration of the active fluid in the diluted active fluid mixture can be processed to provide an average or corrected output signal correlative to the concentration of the active fluid in the diluted active fluid mixture. For such purpose, the monitor can be operatively coupled with a controller, so that the controller responds to the signal(s) from the monitor(s) in the system, and responsively adjusts the system to maintain a predetermined concentration of the active gas in the multicomponent gas mixture formed by the active gas and the carrier gas.

Such signal processing can be carried out by a programmable general purpose computer that is programmed to process the respective output signals of the respective monitoring devices or components, according to a suitable algorithm or computational procedure, to provide a net output signal correlative of the concentration of the active fluid in the diluted active fluid mixture. Alternatively, the signal processing can be carried out by a comparator or bridge circuit, microprocessor, central processing unit (CPU) or other processor, to provide appropriate output for modulating the fluid flow metering device to achieve the desired active fluid concentration in the diluted active fluid mixture.

The active fluid in the dilute fluid supply system of the invention can be of any suitable type, depending on the specific diluted active fluid mixture-using process for which the diluted active fluid mixture is to be provided. The fluid can for example be a gas that is a source material for forming a dopant or trace reagent species, for manufacturing of semiconductor or other microelectronic products. The fluid alternatively could be diluted for use as a calibration standard, as a sterilant for use below hazardous concentration levels, as a reactant for nano-concentration chemical reactions, or used for preparation of low concentration mutagenic agent samples, for research and testing purposes, etc. The active fluid, although typically constituting a single component fluid, can in some embodiments of the invention be provided as a premixed gas mixture, which then is blended with a diluent gas. The diluent gas in turn may be a single component or a multicomponent gas.

The diluted active fluid mixture-using process can be correspondingly varied, and can variously include industrial processes, medical diagnostics, research investigations, agricultural assays, treatment of the body with dilute radiological therapeutic agents, etc. In a preferred end use, the diluted active fluid mixture is dispensed for use in ion implantation to form semiconductor devices or integrated circuitry structures or substrates in microelectronic device manufacture.

The diluent fluid can be of any suitable type, and can variously include single component diluent compositions, as well as multi-component diluent formulations. Illustrative potentially suitable diluent fluids in specific applications of the invention include, without limitation, nitrogen, argon, helium, air, krypton, xenon, xenon halides, hydrogen, oxygen, ammonia, and gaseous organometallic compounds.

Figure 1:
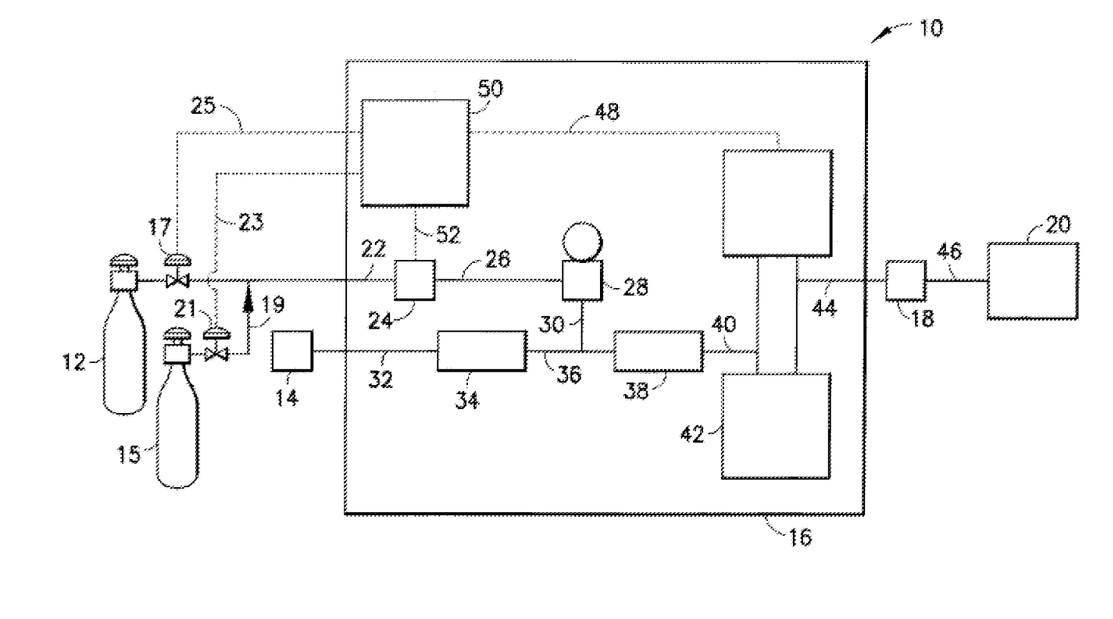
FIG. 1 is a schematic representation of a gas delivery system arranged to supply a dilute gas mixture to an ion implantation semiconductor manufacturing tool.

Referring now to the drawings, FIG. 1 is a schematic representation of a gas delivery system 10 arranged to supply a dilute gas mixture to an ion implantation semiconductor manufacturing tool 20.

The dilute gas supply system 10 includes a neat active gas source 12, which may for example compromise a fluid storage and dispensing vessel such as a conventional high-pressure gas cylinder or alternatively a sub-atmospheric pressure gas dispensing system, e.g., of the type disclosed in U.S. Pat. No. 5,518,528 to Glenn M. Tom, et al. or the type disclosed in U.S. Pat. No. 6,089,027 to Luping Wang, et al.

The neat active gas source 12 thus may comprise a vessel equipped with a valve head, or alternatively coupled with an external regulator, restricted orifice flow control element(s), and other conventional flow circuitry elements. The valve head can contain a conventional flow control valve (head valve) controllable by a hand wheel actuator, or alternatively by an automatic valve controller, e.g., a pneumatic actuator, or electrical solenoid valve actuator, etc.

The neat active gas source 12 is coupled in closed gas flow communication with discharge line 22 having valve 24 and variable restricted flow orifice (RFO) 24 disposed therein. The discharge line 26 downstream of the variable RFO 24 is coupled to mini-pump 28. The mini-pump is operable to pump neat active gas from discharge line 26 into branch line 30, for flow therefrom into line 36 and passage to static mixer 38, along with the added diluent gas in line 36. As a specific example, one such mini-pump that may be usefully employed in the practice of the invention is a MB-41 bellows pump, commercially available from Senior Operations, Inc. (Sharon, Mass., USA). Illustrative of variable RFO devices that may be useful in the practice of the invention is the Model 1 VSO valve, commercially available from Pneutronics Division of Parker-Hannifin (Hollis, N.H., USA).

A dilute gas source 14 is provided in the system, and arranged to discharge diluting gas in line 32 to electronic pressure controller (EPC) 34 for flow therethrough and discharge from the EPC in line 36 for flow to the static mixer 38. Alternatively, a rotary mixer, impeller mixer, eductor, or other mixer could be employed.

The static mixer 38 functions to blend the active gas and the diluting gas, to form a diluted active gas mixture that is discharged from the static mixer in line 40 and passed to the TPIR unit 42 for analysis to determine concentration of the active component in the diluted active gas mixture.

The TPIR in-line gas analyzer 42 is constructed and arranged to generate an output control signal indicative of the concentration of the active gas in the diluted gas stream flowing through the analyzer from line 40 and dispensed from the analyzer 42 in line 44 for flow to the mass flow controller 18. The controlled flowrate stream of diluted active gas mixture is discharged from the mass flow controller 18 into line 46 and flowed therein to downstream gas-using process unit 20, e.g., an ion implant facility or other semiconductor process tool or microelectronic device manufacturing installation.

An electronic signal indicative of the dilute gas concentration in the gas mixture is generated by the TPIR in-line analyzer 42 and is transmitted in signal transmission line 48 to controller 50. The controller 50 responds by generating a control signal that is transmitted in signal transmission line 52 to the variable RFO 24 to adjust the setting of the RFO device and thereby modulate the flow rate of the neat active gas in discharge line 26 that is flowed to the mini-pump 28 for pumping through lines 30 and 36 to the static mixer 38, so that a predetermined concentration of active gas component is maintained in the gas mixture flowed to the TPIR analyzer 42.

Concurrently, the EPC unit 34 functions to maintain a constant set point pressure in the flow path including gas flow lines 36, 40 and 44, so that the pressure of the diluted gas mixture entering the downstream mass flow controller 18 is maintained constant at a desired pressure level. Although the pressure controller is typically employed as a separate and independent component of the blended gas delivery system, in relation to the fluid flow metering device, in some embodiments of the invention the pressure controller can serve as a fluid flow metering device, obviating the need for a separate metering device component.

As shown in FIG. 1, the components of the gas delivery system 10 including variable RFO 24, mini-pump 28, EPC 34, static mixer 38, TPIR analyzer 42, and controller 50, along with associated gas flow lines and signal transmission lines, may be provided in a unitary enclosure 16, to provide a gas blender box as a modular unitary apparatus, with lines 22, 32 and 44 protruding from the gas blender box, or otherwise terminating at the box surface in ports, connectors or other coupling structure, to facilitate connection of such lines to active gas supply 12, diluent gas supply 14 and external flow controller 18, respectively.

In operation, neat (100% concentration) active gas is dispensed from neat gas source 12 into discharge line 22 containing variable RFO 24, which operates to control the delivery rate of the neat gas. Line 22 contains isolation valve 17, which is open during the dispensing of gas from the neat active gas source 12, while isolation valve 21 in the branch line 19 is closed. The resulting modulated flow rate neat gas from active gas source 12 in discharge line 22 is pumped by mini-pump 28 through line 30 to line 36 for introduction to the static mixer 38 for mixing therein with the diluting gas stream flowed from diluting gas source 14 through line 32 and EPC 34 to line 36. The resulting mixed dilute gas stream (constituted by the active gas and diluting gas) is flowed in line 40 to the TPIR in-line gas analyzer 42, where concentration of active gas in the gas mixture is determined and used to responsively generate the control signal transmitted in signal transmission line 48 to the controller 50. The controller responsively generates a control signal transmitted in line 52 to modulate the variable RFO, i.e., to increase or decrease the active gas delivery rate to achieve the desired diluted active gas concentration in the diluted active gas mixture in line 44 flowed to the downstream process unit 20.

Although illustratively described as a TPIR unit, the in-line gas monitor/analyzer 42 alternatively can operate by any suitable mode of operation, including for example, photometry, spectroscopy, electrochemistry, acoustic monitoring, thermal monitoring, etc., or a combination of two or more of such modes of operation, to determine concentration of active gas in the gas mixture as diluted for flow to the downstream gas-using process. In one alternative embodiment of the invention, the gas monitor/analyzer is an infrared photometric monitor of the type disclosed in U.S. Pat. No. 6,909,973.

Additionally, while the embodiment shown in FIG. 1 is arranged with the fluid flow metering device dispensing the active fluid, the monitor sensing concentration of active fluid, and the pressure controller controlling diluent fluid flow, the delivery system shown in FIG. 1 may alternatively be configured so that the fluid flow metering device is arranged to dispense the diluent fluid, the monitor is arranged to sense concentration of the diluent fluid in the diluted active fluid mixture, and the pressure controller is arranged to control active fluid flow to maintain the predetermined pressure of the diluted active fluid mixture dispensed from the system. As a still further alternative, multiple fluid flow metering devices, monitors and pressure controllers may be employed for each of the active and diluent streams, and/or multiple active and/or diluent fluids can be blended in the blender delivery system, as may be necessary or desirable in a given application of the invention.

The active fluid as mentioned can be of any suitable type, including, for example, in the case of semiconductor process or other microelectronic process usage, gases such as hydrides (e.g., arsine, phosphine, silane, germane, etc.), acid gases (e.g., $SiHCl_3$, $SiF_4$, $SiH_2Cl_2$), boranes, etc. Diluting gases for such semiconductor or microelectronic device manufacturing applications can include, for example, homonuclear diatomic species (e.g., $H_2$, $N_2$, $O_2$) or atomic gases (e.g., argon, helium, and the like). The active fluid can be a single component fluid, or alternatively, a multicomponent fluid, as may be appropriate in a given implementation of the invention. Illustrative gases that may be present in or constitute the active fluid in specific applications of the invention include, without limitation, arsine, phosphine, hydrogen, nitrogen trifluoride, ammonia, nitrous oxide, tungsten hexafluoride, hydrogen chloride, chlorine, hydrogen bromide, diborane, methane, methane, ethylene, chloroform, propane, butane, sulfur hexafluoride, nitrogen, fluorine, ammonium fluoride, ammonium phosphate, ammonium hydroxide, boron trifluoride, boron trichloride, dichlorosilane, germane, tetrafluoromethane, trifluoromethane, difluoromethane, methyl fluoride, hexafluoroethane, pentafluoromethane, perfluoropropane, octafluorocyclobutane, nitric oxide, silane, silicon tetrachloride, silicon tetrafluoride, trichlorosilane, hydrogen selenide, and organometallic reagent gases.

It will be recognized that while the invention is illustratively shown with reference to delivery of dilute gas species as the active fluid, the invention is also amenable to delivery of blends of materials in the liquid phase including an active liquid of a desired concentration.

It will also be recognized that the dilute fluid supply system of the invention can be operated and arranged to supply a plurality of active species, e.g., a blend of complex dopants.

In another embodiment, the active fluid and/or the diluent fluid may include a supercritical fluid.

The safety advantages of utilizing the system of the present invention are enhanced when the active fluid source is a sub-atmospheric gas source such as those of the aforementioned Tom, et al and Wang, et al patents.

Thus, the system of the present invention, by virtue of its use of a real-time fluid monitor, provides a continuous measure of the fluid mixture to ensure a constant diluted active fluid concentration in the delivered dilute fluid mixture, and at the same time provides the delivered dilute fluid mixture at a set point pressure (determined by the EPC or other pressure controller unit) that accommodates downstream flow control by the end user, without loss of accuracy of the in-line analyzer or deviation from the desired concentration level of the active fluid component in the diluted fluid mixture. If active fluid concentration deviates from a set point value, a control signal is sent from the fluid monitor to the active fluid metering device, e.g., the variable RFO, to increase or decrease the active fluid delivery rate to maintain the desired concentration value.

When embodied in a gas blender box as described hereinabove, the system of the invention provides a conveniently transported and installed point-of-use gas delivery unit, which can be readily connected to source gas vessels or other gas supply means and to the downstream flow controller and gas-utilizing process facility, to provide the desired amount of diluted gas mixture containing a precisely controlled concentration of active component.

By utilizing an electronic pressure controller or other pressure controller instead of the mass flow controller employed in prior fluid delivery systems to control the flow of diluent gas, a constant pressure can be maintained in the gas blender, regardless of what overall flow rate is selected by the end user for delivery to the downstream gas-utilizing installation. As an illustrative example, the MKS 640 Absolute Pressure Controller, commercially available from MKS, Inc. (Wilmington, Mass., USA), is an electronic pressure controller that can be usefully employed for such purpose. Maintaining the gas blender at a constant pressure allows the analyzer to determine concentration of the diluted active gas component in an accurate manner at all times.

Additionally, once the end user turns off the mass flow controller or other downstream flow control that controls the flow of the fluid mixture from the fluid blender into the downstream fluid-utilizing unit, the pressure controller in the fluid blender system will terminate the flow of the diluent fluid, since the pressure inside the fluid blender box will reach the pressure set point of the pressure controller. At such point, the flow of the active fluid will also turn off, since the active fluid is being controlled by the variable RFO (or other flow controller), which is operatively coupled with the controller that in turn is interconnected with the in-line analyzer. Once the flow of fluid mixture from the blender is stopped, the in-line analyzer will sense the concentration of the active fluid in the fluid mixture, which will rise slightly above the controller set point, and cause the variable RFO (or other flow controller) to close by action of the controller, thereby terminating the flow of active fluid into the blender as well.

Subsequently, when the end user initiates flow of the fluid mixture from the fluid blender to the downstream gas-utilizing installation, the EPC (or other pressure controller) will allow the flow of diluent fluid into the fluid blender again, so that the overall pressure in the blender is maintained at the EPC (or other pressure controller) set point, and the variable RFO (or other flow controller) will open up again to allow the active fluid to enter the blender as well, so that the active fluid concentration set point of the controller is thereafter maintained.

The blender delivery system of the invention also can be implemented with an end point detection capability and multiple active fluid packages arranged for sequential use, so that approach to exhaustion of a package is detected and the exhausting package is switched out while a fresh package of active fluid is switched in, to maintain continuity of dispensing operation. The end point detection capability can additionally be employed if the diluent fluid source is of packaged form, with corresponding switching of diluent fluid packages, from an exhausted or near-exhausted package to a fresh package of the fluid.

Thus, the gas delivery system 10 shown in FIG. 1 may be arranged as illustrated with two active gas sources 12 and 15, arranged for operation so that upon exhaustion of the active gas source 12, such source can be isolated and a fresh source brought on-stream into active dispensing operation. For this purpose, the gas delivery system 10 features two active gas sources 12 and 15, with 12 as previously described being joined by discharge line 22 to the variable restrictive flow orifice 24. An isolation valve 17 is disposed in line 22, so that source 12 can be taken off-stream when it is exhausted.

The source 15 contains active gas and is joined by branch line 19, containing isolation valve 21 therein, to the discharge line 22. When source 12 is exhausted, flow control valve 17, which is open during normal dispensing operation from such source, then is closed, and concurrently flow control valve 21, which theretofore had been closed, is opened, to enable flow of active gas from the source 15 through discharge branch line 19 to the discharge line 22.

In this manner, source 12 may be switched out to ensure continuity of flow of active gas, by switch-in of source 15 upon depletion or approach to depletion of source 12.

The gas delivery system 10 uses the variable RFO 24 as a flow control device. The variable RFO is connected to controller 50 and the controller 50 is additionally coupled to the TPIR analyzer 42. The TPIR analyzer measures the gas concentration downstream and responsively sends a concentration-sensing signal to controller 50 through signal transmission line 48. Based on the controller concentration set point, the orifice of the variable RFO 24 will either open or close until the concentration set point in the controller 50 matches the TPIR concentration reading.

As active gas flows from the on-stream source 12, the pressure inside such source decreases. As the source pressure decreases, the orifice of the variable RFO 24 will open further so that the set flow rate of active gas can be maintained. The variable RFO in one embodiment opens and closes based on the amount of voltage being supplied to it, as a voltage-responsive flow control device. The higher the voltage that is supplied to the variable RFO, the more open is the orifice of such device. Accordingly, by monitoring the voltage being supplied to the orifice, the endpoint of the active gas source 12 can be determined, since as the source 12 is progressively emptied, the pressure of the active gas dispensed from such source drops as well. In order to maintain gas concentration at the controller set point as measured by the TPIR analyzer 42, the orifice of the variable RFO 24 will continue to open further and further, until there is no more pressure drop across the orifice. Since the variable RFO is operated by a voltage source, when maximum voltage is being supplied to the variable RFO, the source 12 is nearly empty, signaling the endpoint of such source, and the corresponding need to isolate such source 12 and switch-in the fresh source 15.

The controller 50 therefore is programmatically arranged to monitor voltage being applied to the variable RFO and when such voltage is at a predetermined value, the controller operates to transmit a control signal to isolation valve 17 in signal transmission line 23, to close such valve and thereby isolate the source 12 so that it can be uncoupled from the flow circuitry and removed from the gas delivery system. Concurrently, the controller 50 transmits a signal in signal transmission line 25 to isolation valve 21 in line 19, opening such valve so that fresh active gas then is supplied to the downstream flow circuitry from source 15.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

The invention claimed is:

1. A gas source assembly, comprising:
   a first fluid supply vessel containing a first fluid;
   a second fluid supply vessel containing a second fluid;
   a fluid flow metering device adapted to dispense one of the first and second fluids;
   a mixer arranged to mix the first and second fluids to form a diluted fluid mixture;
   a monitor arranged to sense concentration of any of the first fluid and the second fluid in the diluted fluid mixture;
   a controller arranged to receive from the monitor a signal indicative of concentration of the first fluid and/or the second fluid in the diluted fluid mixture, and to responsively adjust the fluid flow metering device to achieve a predetermined concentration of first fluid in the diluted fluid mixture; and
   a pressure controller disposed directly in a fluid flow path upstream of the mixer, arranged to sense and control pressure of the other of the first and second fluids, and configured to maintain at the mixer a predetermined pressure of said other of the first and second fluids.

2. A gas source assembly according to claim 1, wherein the monitor is selected from the group consisting of TPIR monitors, photometric monitors, spectroscopic monitors, electrochemical monitors, acoustic monitors, thermal monitors, and infrared photometric monitors.

3. The gas source assembly according to claim 1, comprising, as a first fluid and a second fluid:
   (i) boron trifluoride and hydrogen;
   (ii) silicon tetrafluoride and hydrogen;
   (iii) phosphine and hydrogen;
   (iv) diborane and hydrogen;
   (v) silane and hydrogen; or
   (vi) germane and hydrogen.

4. The gas source assembly according to claim 1, wherein the second fluid comprises one or more of ammonia, nitrogen, helium, argon, krypton or xenon.

5. The gas source assembly according to claim 1, comprising, as a first fluid and a second fluid, boron trifluoride and hydrogen.

6. The gas source assembly according to claim 1, comprising, as a first fluid and a second fluid, silicon tetrafluoride and hydrogen.

7. The gas source assembly according to claim 1, comprising, as a first fluid and a second fluid, phosphine and hydrogen.

8. The gas source assembly according to claim 1, comprising, as a first fluid and a second fluid, diborane and hydrogen.

9. The gas source assembly according to claim 1, comprising, as a first fluid and a second fluid, silane and hydrogen.

10. The gas source assembly according to claim 1, comprising, as a first fluid and a second fluid, germane and hydrogen.

11. The gas source assembly according to claim 1, wherein the first fluid and the second fluid are gases and the mixer comprises a mixing chamber housing a mixing device arranged to mix the first gas with the second gas.

12. The gas source assembly according to claim 1, wherein the first fluid comprises at least one fluid species selected from the group consisting of arsine, phosphine, nitrogen trifluoride, ammonia, nitrous oxide, tungsten hexafluoride, hydrogen chloride, chlorine, hydrogen bromide, diborane, methane, ethylene, chloroform, propane, butane, sulfur hexafluoride, fluorine, ammonium fluoride, ammonium phosphate, ammonium hydroxide, boranes, boron trifluoride, boron trichloride, dichlorosilane, germane, tetrafluoromethane, trifluoromethane, difluoromethane, methyl fluoride, hexafluoroethane, perfluoropropane, octafluorocyclobutane, nitric oxide, silane, silicon tetrachloride, silicon tetrafluoride, trichlorosilane and hydrogen selenide.

13. The gas source assembly according to claim 1, wherein the second fluid comprises at least one fluid species selected from the group consisting of nitrogen, argon, helium, krypton, xenon, xenon halides, hydrogen, oxygen and ammonia, and wherein when the second fluid consists of hydrogen, the first fluid does not consist of arsine.

14. The gas source assembly according to claim 13, wherein the first fluid comprises at least one fluid species selected from the group consisting of arsine, phosphine, nitrogen trifluoride, ammonia, nitrous oxide, tungsten hexafluoride, hydrogen chloride, chlorine, hydrogen bromide, diborane, methane, ethylene, chloroform, propane, butane, sulfur hexafluoride, fluorine, ammonium fluoride, ammonium phosphate, ammonium hydroxide, boranes, boron trifluoride, boron trichloride, dichlorosilane, germane, tetrafluoromethane, trifluoromethane, difluoromethane, methyl fluoride, hexafluoroethane, perfluoropropane, octafluorocyclobutane, nitric oxide, silane, silicon tetrachloride, silicon tetrafluoride, trichlorosilane and hydrogen selenide.

15. A gas source assembly, comprising:
 a first fluid supply vessel containing a first fluid;
 a second fluid supply vessel containing a second fluid;
 a fluid flow metering device adapted to dispense the first fluid;
 a mixer arranged to mix the first and second fluids to form a diluted fluid mixture;
 a monitor arranged to sense concentration of the first fluid in the diluted fluid mixture;
 a controller arranged to receive from the monitor a signal indicative of concentration of the first fluid in the diluted fluid mixture, and to responsively adjust the fluid flow metering device to achieve a predetermined concentration of the first fluid in the diluted fluid mixture; and
 a pressure controller disposed between the second fluid supply vessel and the mixer, arranged to sense and control pressure of the second fluid, and configured to maintain at the mixer a predetermined pressure of said second fluid.

16. The gas source assembly according to claim 1 wherein the pressure controller does not use a signal from the monitor to maintain at the mixer the predetermined pressure of the other of the first and second fluids.

17. The gas source assembly according to claim 1 wherein the assembly does not include a pressure control to control pressure of the one of the first and second fluids dispensed from the metering device as supplied to the mixer.

18. The gas source assembly according to claim 1 wherein the assembly does not include a flow metering device to control flow of the other of the first and second fluids as supplied to the mixer.

19. The gas source assembly according to claim 1 wherein the first fluid supply source contains a gas at sub-atmospheric pressure.

20. The gas source assembly according to claim 1 wherein the first fluid supply source contains a neat active gas.

21. The gas source assembly according to claim 1 wherein the first fluid supply source contains gas sorptively retained on a physical adsorbent.

* * * * *